Figure 1:
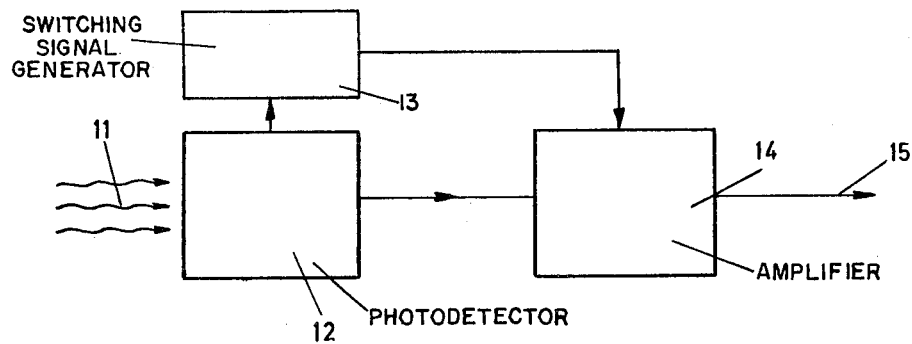

United States Patent [19]

Skagerlund

[11] 3,999,060
[45] Dec. 21, 1976

[54] DEVICE FOR RECEIVER FOR OPTICAL SIGNALS

[75] Inventor: Lars-Erik Skagerlund, Karlskoga, Sweden

[73] Assignee: AB Bofors, Bofors, Sweden

[22] Filed: Feb. 11, 1975

[21] Appl. No.: 549,112

[30] Foreign Application Priority Data

Feb. 18, 1974 Sweden .................... 7402085

[52] U.S. Cl. .................... 250/214 R; 250/214 AG; 250/214 B; 330/103; 330/110; 356/224
[51] Int. Cl.² ................ G01J 1/44; H01J 39/12
[58] Field of Search ........ 250/206, 214 R, 214 AG, 250/214 B, 214 C, 214 A, 555, 557; 356/224; 330/110, 86, 97, 103; 328/209

[56] References Cited
UNITED STATES PATENTS

| | | | |
|---|---|---|---|
| 3,053,985 | 9/1962 | Grammer et al. | 250/212 |
| 3,092,729 | 6/1963 | Cray | 330/97 X |
| 3,209,266 | 9/1965 | White | 330/103 X |
| 3,604,941 | 9/1971 | Crum | 250/214 R X |
| 3,701,036 | 10/1972 | Stefenel | 330/110 X |

Primary Examiner—Eugene La Roche
Attorney, Agent, or Firm—Pollock, Vande Sande & Priddy

[57] ABSTRACT

A device is provided for controlling the sensitivity of a receiver of the type comprising a photosensitive element operative to convert radiant energy into electric signals and having an amplifier connected to the output of the photosensitive element and signal processing members for separating a useful signal from interfering background radiation. A sensor device is connected to the photosensitive element to sense the direct current which the element emits in response to radiation from the sun or other strong sources of disturbance, the sensor device being operative to emit a signal when the direct current exceeds a predetermined value, and a switching device responsive to said signal operates to switch the amplifier from a given fixed sensitivity level to a lower fixed level of sensitivity. The arrangement may comprise an amplifier having a feedback circuit, with the switching device taking the form of a diode which is selectively driven into conduction by said signal and which operates in its conducting state to connect a shunt resistor across the amplifier feedback circuit.

8 Claims, 6 Drawing Figures

DEVICE FOR RECEIVER FOR OPTICAL SIGNALS

The present invention relates to a device for controlling the sensitivity of a receiver for optical signals which comprises a photosensitive element, e.g. a photodetector, arranged to pick up the optical signals and convert these into electric signals, an electric amplifier connected to the output of the photosensitive element, and signal processing members for separating a useful signal received from interfering background radiation.

Optical receivers of the kind to which the invention relates are mainly used for receiving electromagnetic radiation with wavelengths of less than 10 $\mu$m which through modulation or in some other way have been made carriers of useful information. Among the fields of applications may be mentioned transmission links for data, speech etc., control systems for missiles, rangefinders, proximity fuzes and active homing devices. For receivers of this kind, it is a desire to be able to receive as weak signals as possible. It is a common practice to give the useful signal such a form that the amplifier of the receiver can be connected to alternating current. The influence of direct current from the photodetector owing to incident background illumination can thereby be eliminated and the sensitivity of the receiver will be limited only by the noise from the photodetector and the input stage of the following amplifier. A common method of considerably reducing the interfering influence of the noise is to introduce a threshold in connection with the amplifier which is set so high above the effective value level of the noise that there is sufficiently little probability that the noise will exceed the threshold level. This is particularly appropriate when the signal consists of short pulse trains. The sensitivity of the receiver is then determined by the signal having to be sufficiently powerful to exceed the threshold level. It is very common that the receiver is positioned in such a way that it can be subjected to direct incident sunlight. The photodetector will then generate a shot noise which usually is considerably more powerful than the contributions from all other sources of noise. It is therefore necessary to set the threshold level rather high, and quite a lot of receiver sensitivity is thereby lost, compared with when it is not necessary to dimension with consideration to direct incident sunlight.

A previously known method of avoiding this is to make the threshold variable and to allow the noise level to control the threshold. A frequency discriminator is then allowed to sense how often the threshold value is exceeded by noise pulses, and if the frequency of the exceeding of the threshold tends to increase or decrease, the discriminator gives a pilot signal to the threshold, so that this will be raised or lowered. However, the drawback of this is that such devices will often be very complicated, and in the cases when there are requirements for a very low probability that the noise will exceed the threshold level, the device must be dimensioned in such a way that it will be very slow, which is often unacceptable. A method of avoiding the lastmentioned drawback is to use two variable but in relation to each other fixed thresholds, the higher threshold then being used to detect the signal, and the lower threshold for the frequency discriminator, but this gives a still more complicated device.

The purpose of the present invention is to achieve a device in which the above-mentioned drawbacks have been eliminated. The device is then mainly characterized in that to the photosensitive element there is connected a member for sensing the direct current of e.m.f. emitted by the photosensitive element when it is subjected to radiation from the sun or some other strong source of disturbance, and that said member is arranged to emit a signal when the direct current or the e.m.f. exceeds a predetermined value, the signal then initiating a change-over in the following amplifier or signal-processing members so that these are switched over from a higher fixed sensitivity to a lower fixed sensitivity.

Figure 2:
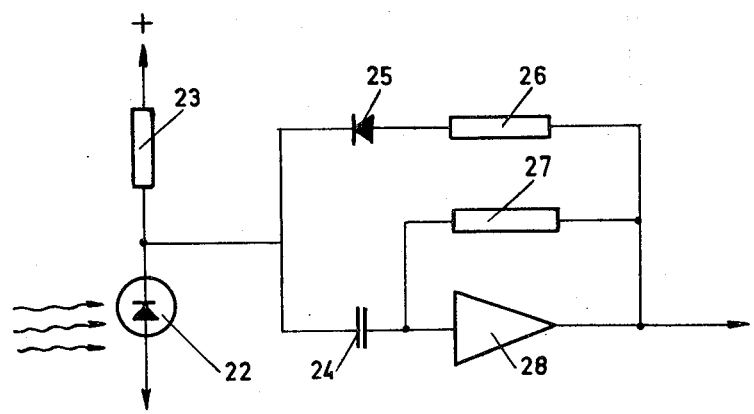
Figure 3:
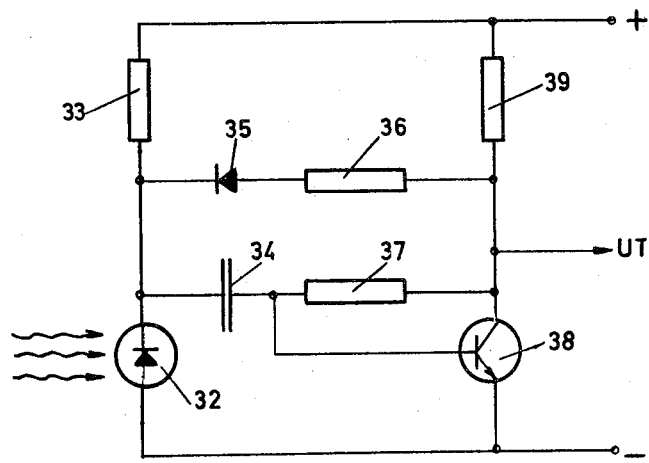
Figure 4:
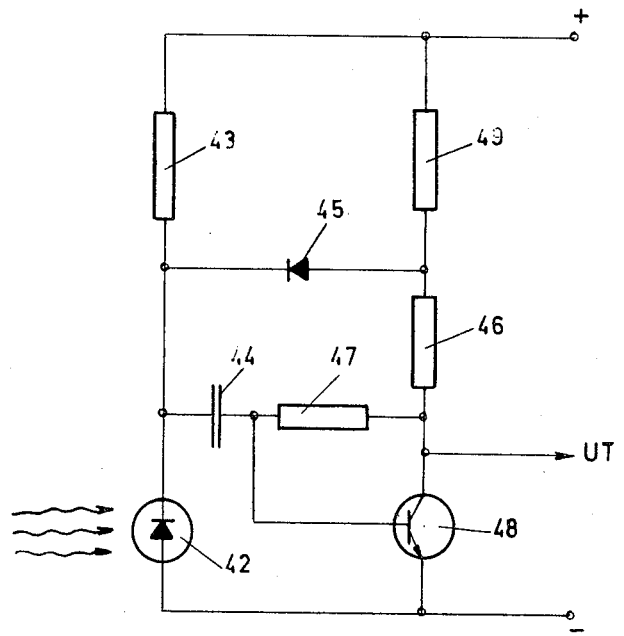
Figure 5:
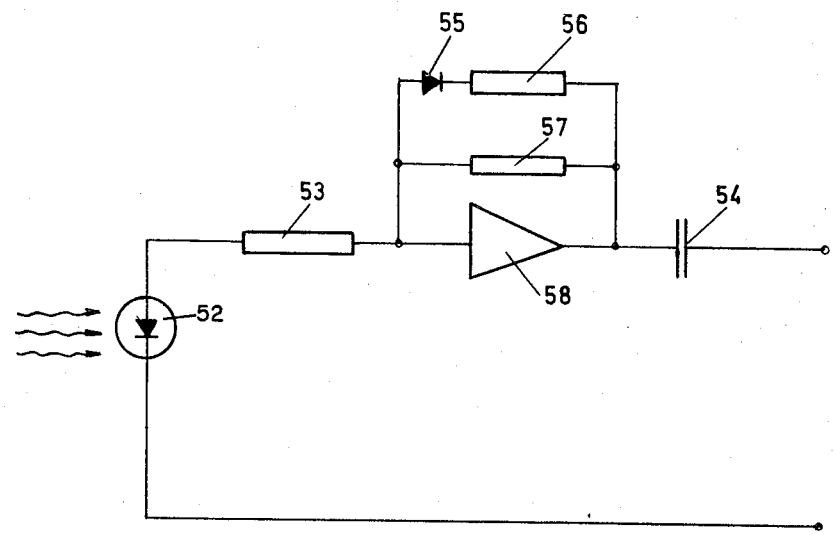
Figure 6:
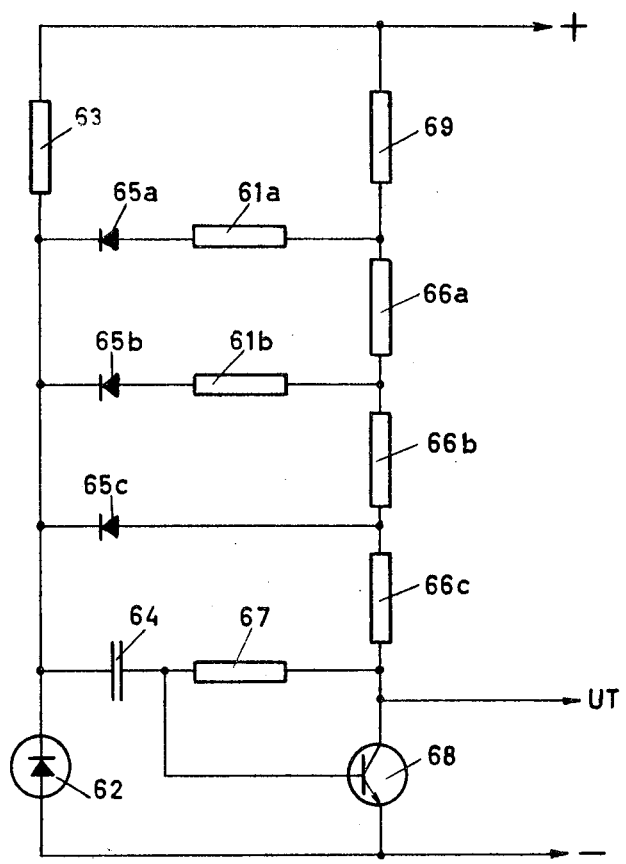

In the following, the invention will be described in more detail, with reference to the accompanying drawings, in which FIG. 1 shows schematically the basic design of the invention, FIG. 2 in a circuit diagram shows how the change-over switching is easily accomplished, FIG. 3 shows its application to an amplifier stage with a transistor, FIG. 4 shows an improved variant of the device according to FIG. 3, FIG. 5 shows an application of the invention with a photovoltaic detector, and FIG. 6 shows a variant of the device according to FIG. 3, whereby switching between several sensitivity levels is obtained.

FIG. 1 shows the basic design of the invention schematically, by means of a block diagram. The numeral 12 designates a photodetector which in a known way is arranged in the optical system of the receiver so that its photocathode is struck by the incident light through the optical system, which in the figure is indicated with arrows 11, to the left of the photodetector 12. The output of the photodetector is connected to an amplifier 14, which in the present case includes signal processing devices, which amplify and pass on the signal emitted by the photodetector. The amplifier is then made in such a way that only input signals of which the amplitude exceeds a certain threshold value are amplified and passed on to the output of the amplifier. The signals 15 emitted frrom the output of the amplifier are fed to devices not shown for utilizing the signals.

To the output of the photodetector 12 there is also connected a device 13 which senses the direct current of e.m.f. emitted from the photodetector, and emits a signal for switching over in the amplifier 14 if the direct current or e.m.f. exceeds a certain value.

FIG. 2 shows, in more detail, an embodiment of an electric circuit for achieving said change-over switching in the amplifier. A photodetector 22 is connected via a series resistor 23 to a source of voltage designated (+) (−) in the figure. When the photodetector 22 receives irradiation, a signal occurs on its output which is taken out via a capacitor 24 to the amplifier 28, which has a feedback connection through a resistor 27. Between the detector 22 and the output of the amplifier 28 a diode 25 is connected in series with a resistor 26. When the photodetector has been subjected to sufficiently strong radiation, e.g. at direct incident sunlight, owing to the direct current from the detector the voltage drop over the series resistor 23 of the detector will be so high that the diode 25 will be driven into conduction. Its series resistance 26 will then, from the point of view of the signal, shunt the feedback connection resistance 27 and the amplification from the amplifier 28 will be lower, i.e. the amplifier will be switched over from a higher, fixed sensitivity to a lower, fixed sensitivity.

FIG. 3 shows an amplifier stage comprising a transisitor 38 with a collector resistance 39. For the rest, the design and mode of functioning are entirely analogous to the device shown in FIG. 2, i.e., elements 32–37 inclusive of FIG. 3 correspond to elements 22–27 of FIG. 2. When the photodetector 32 is subjected to sufficiently strong radiation, the voltage drop over the series resistor 33 of the detector will be so high that the diode 35 will come into conduction, and its series resistor 36 will then from the point of view of the signal shunt the feedback connection resistance 37 of the transistor.

FIG. 4 shows a variant of the device according to FIG. 3, whereby it becomes possible for the detector to have a higher working voltage at incident sunlight. In this case, the collector resistor of the transistor 48 consists of two resistors 46 and 49, connected in series, and the diode 45 is connected between the output of the detector 42 and the point between the two collector resistors 46 and 49. For the rest, this device is analogous to the device shown in FIG. 3. The signal from the photodetector 42 is taken out via the capacitor 44 to the transistor 48. When the diode comes into conduction, the resistor 46 from the point of view of the signal will be connected in parallel with the feedback connection resistor 47 of the transistor, and lower amplification will be obtained.

FIG. 5 shows a further variant, which comprises a photovoltaic detector 52 connected to an amplifier 58, the amplification of which in the case of weak background radiation is determined by a series resistor 53 and the feedback connection resistor 57, connected in parallel across the amplifier 58. Parallel to the last-mentioned resistor a diode 55 is connected in series with a shunt resistor 56. The working points of the amplifier are chosen in such a way that the diode 55 is normally somewhat biased in the reverse direction. If the photodetector is subjected to sufficiently strong radiation, it will generate an e.m.f. which influences the working points of the amplifier so that the diode 55 will come into conduction and the shunt resistance 56 from the point of view of the signal will be connected in parallel with the feedback connection resistor 57.

FIG. 6 shows a variant of the device acording to FIG. 3 in which several diodes 65 a–c are connected in the circuit. The diodes then connect different chains of resistors at different levels of detector direct current. When the direct current from the detector 62 increases, the uppermost diode 65a will first become conducting, and the feedback connection resistor 67 of the transistor 68 will be connected in parallel from the point of view of the signal with a resistor chain comprising four resistors 61a, 66a, 66b, 66c, as the detector current continues to increase, the next diode 65b will become conducting, and two of the resistors 61a, 66a will then be shunted with a further resistor 61b and finally, with still further increase of detector current, the lowermost diode 65c will become conducting, so that only one resistor 66c will be connected in parallel with the feedback connection resistor 67.

The invention is not limited to the embodiments described above and shown in FIGS. 2–6, but can be varied and modified in many ways within the scope of the following claims.

I claim:

1. In a receiver for optical signals of the type comprising a photosensitive element arranged to pick up comparatively weak optical signals and to convert such optical signals into useful electrical signals, said receiver including an amplifier and associated signal processing members connected to the output of the photosensitive element for processing said useful electrical signals, the improvement wherein said receiver includes additional means for rendering said receiver relatively insensitive to incident radiation of significantly higher levels than the levels of said comparatively weak optical signals thereby to separate said useful electrical signals from undersirable signals produced when said photosensitive element is subjected to direct incident sunlight or other comparatively strong sources of interfering radiation, said improvement comprising a separate signal-responsive device the operation of which is dependent only on the magnitude of the slowly varying high-level signal at the output of said photosensitive element, said signal-responsive device including a switching device operative to switch said amplifier and its associated signal processing members from a higher fixed sensitivity to a lower fixed sensitivity when the magnitude of the electrical signal produced at the output of the photosensitive element exceeds a predetermined value in response to exposure of said photosensitive element to interfering radiation from the sun or other strong source of disturbance.

2. The device of claim 1 wherein said signal-responsive device includes means connected to the output of said photosensitive element and subjected to the slowly varying high-level signal at the output of said photosensitive element to control said switching device.

3. The device of claim 1 wherein said switching device includes means operative to initiate switching between several different sensitivity levels in dependence on the corresponging levels of the slowly varying high-level signal produced at the output of said photosensitive element.

4. The device of claim 3 wherein said amplifier includes a feedback resistor, said switching device comprising a plurality of resistors connected to one end of said feedback resistor, a plurality of diodes connected to different ones of said plurality of resistors, said sensor device being operative to render different ones of said diodes conductive at different levels of direct current from said detector respectively, thereby to effectively connect different values of resistance in parallel with the feedback resistor of said amplifier, to cause said switching between several different sensitivity levels.

5. The device of claim 1 wherein said amplifier includes a feedback circuit, said switching device comprising a diode and a resistor connected in series with one another between the output of said photosensitive element and the output of said amplifier across at least a portion of said amplifier feedback circuit, said diode being connected in a polarity such that, when said photosensitive element is subjected to a predetermined level of interfering radiation, the diode will go into conduction to cause said resistor effectively to shunt said feedback circuit portion of said amplifier to lower the amplification of said amplifier.

6. The device of claim 5 wherein said amplifier comprises a transistor having a resistor in its collector circuit.

7. The device of claim 5 wherein said amplifier consists of a transistor having a collector resistor comprising two resistors connected in series, said feedback circuit comprising a feedback resistor connected between the collector and the base of said transistor, said diode being so connected to said resistors that when said diode goes into conduction, it effectively connects one of said collector resistors in parallel with said feedback resistor to lower tha amplification of said amplifier.

8. The device of claim 5 wherein said photosensitive element consists of a photovoltaic detector, and a further resistor connected in series between the output of said detector and the input of said amplifier.

* * * * *